(12) United States Patent
Surdeanu

(10) Patent No.: US 7,214,592 B2
(45) Date of Patent: May 8, 2007

(54) METHOD AND APPARATUS FOR FORMING A SEMICONDUCTOR SUBSTRATE WITH A LAYER STRUCTURE OF ACTIVATED DOPANTS

(75) Inventor: Radu Catalin Surdeanu, Heverlee (BE)

(73) Assignees: Interuniversitair Microelektronica Centrum (IMEC), Leuven (BE); Koninklijke Philips Electronics N.V., Ba Eindoven (NL)

( * ) Notice: Subject to any disclaimer, the term of this patent is extended or adjusted under 35 U.S.C. 154(b) by 292 days.

(21) Appl. No.: 10/966,145

(22) Filed: Oct. 15, 2004

(65) Prior Publication Data
US 2005/0112831 A1    May 26, 2005

(30) Foreign Application Priority Data
Oct. 17, 2003   (EP)   .................................. 03447260

(51) Int. Cl.
*H01L 21/336*   (2006.01)
(52) U.S. Cl. ...................... 438/306; 438/529; 438/916; 438/528; 257/E21.133
(58) Field of Classification Search ................ 438/481, 438/485, 486, 222, 300–306, 528, 529, 916, 438/FOR. 268; 257/E21.133
See application file for complete search history.

(56) References Cited

U.S. PATENT DOCUMENTS

| | | | |
|---|---|---|---|
| 4,659,392 A | | 4/1987 | Vasudev |
| 5,422,506 A | | 6/1995 | Zamapian |
| 6,521,502 B1 | * | 2/2003 | Yu .............................. 438/305 |
| 6,555,439 B1 | * | 4/2003 | Xiang et al. ................. 438/305 |
| 6,680,250 B1 | * | 1/2004 | Paton et al. ................. 438/660 |
| 6,682,980 B2 | * | 1/2004 | Chidambaram et al. .... 438/302 |
| 6,689,671 B1 | * | 2/2004 | Yu et al. ...................... 438/486 |
| 6,699,771 B1 | * | 3/2004 | Robertson .................... 438/420 |
| 6,710,407 B2 | * | 3/2004 | Yamamoto ................... 257/344 |
| 7,091,097 B1 | * | 8/2006 | Paton et al. ................. 438/303 |

(Continued)

FOREIGN PATENT DOCUMENTS

WO    WO 02/41383 A1    5/2002

OTHER PUBLICATIONS

Peterstrom, S., Double solid phase epitaxy of germanium implanted silicon on sapphire, SOS/SOI Technology Conference, 1990., 1990 IEEE Key West, Fl., USA Oct. 2-4, 1990, New York, NY, USA, IEEE, US, (Oct. 2, 1990), pp. 125-126, XP010036857.

*Primary Examiner*—George R. Fourson
*Assistant Examiner*—John M. Parker
(74) *Attorney, Agent, or Firm*—Knobbe Martens Olson & Bear LLP

(57) ABSTRACT

Methods of forming semiconductor devices with a layered structure of thin and well defined layer of activated dopants, are disclosed. In a preferred method, a region in a semiconductor substrate is amorphized, after which the region is implanted with a first dopant at a first doping concentration. Then a solid phase epitaxy regrowth step is performed on a thin layer of desired thickness of the amorphized region, in order to activate the first dopant only in this thin layer. Subsequently, a second dopant is implanted in the remaining amorphous region at a second doping concentration. Subsequent annealing of the substrate activates the second dopant only in said remaining region, so a very abrupt transition between dopant characteristics of the thin layer with first dopant and the region with the second dopant is obtained.

15 Claims, 2 Drawing Sheets

U.S. PATENT DOCUMENTS

| | | |
|---|---|---|
| 2001/0018255 A1 | 8/2001 | Kim et al. |
| 2002/0061626 A1 | 5/2002 | Feudel et al. |
| 2002/0086502 A1* | 7/2002 | Liu et al. .................... 438/530 |
| 2004/0121565 A1* | 6/2004 | Wieczorek et al. ......... 438/481 |
| 2004/0245583 A1* | 12/2004 | Horiuchi et al. ............ 257/408 |
| 2005/0056899 A1* | 3/2005 | Rendon et al. ............. 257/408 |
| 2005/0158956 A1* | 7/2005 | Poon et al. ................. 438/282 |
| 2006/0006427 A1* | 1/2006 | Tan et al. ................... 257/227 |
| 2006/0011984 A1* | 1/2006 | Currie ........................ 257/352 |
| 2006/0011987 A1* | 1/2006 | Makovicka et al. ........ 257/369 |

* cited by examiner

METHOD AND APPARATUS FOR FORMING A SEMICONDUCTOR SUBSTRATE WITH A LAYER STRUCTURE OF ACTIVATED DOPANTS

TECHNICAL FIELD OF THE INVENTION

The present invention relates to a method for providing a layer of activated dopants in a semiconductor substrate.

BACKGROUND OF THE INVENTION

Progressive miniaturization of semiconductor devices leads to scaling down of the structures of such devices. For example, gate lengths become shorter and shorter, e.g. less than 100 nm. With such short gate lengths the drain and the source of the device may start to interact independently of the gate, which deteriorates performance of the semiconductor device. This effect is called the "short channel effect".

In order to counteract this effect, modem semiconductor devices comprising a first main electrode extension, such as e.g. a source, and a second main electrode extension, such as for example a drain, furthermore comprise a boundary region, such as e.g. a pocket or halo surrounding the first and second main electrode extension. It is important that these boundary regions have well defined properties. In particular, their position should be very close to the corresponding main electrode extension, which should be highly activated with the appropriate dopant and be very thin. Up to now, said boundary regions have been formed by implanting a certain dopant in the semiconductor substrate to a certain depth, followed by implanting and activating the desired dopant for the main electrode extensions.

A method to obtain highly activated regions in solid state devices is solid phase epitaxy regrowth (SPER). The technique is useful in the fabrication of highly activated, abrupt, ultra-shallow junctions for first and second main electrode extensions in MOSFET-devices. In particular, SPER is used to recrystallize regions of amorphous semiconductor material that has been doped with a dopant.

U.S. Pat. No. 6,521,502 describes a method of manufacturing source and drain junction extensions and halo regions using solid phase epitaxy activation. The method described comprises the steps of deep amorphization by means of ion implantation to form deep amorphous regions in the semiconductor substrate. Next, shallow source and drain extensions are formed via source and drain extension dopant implant. In a next step a tilted angle halo dopant implant is performed in order to form halo layers. Furthermore, dielectric spacers are formed and deep source and drain implants are performed. In a last step extensions, deep regions and halo regions are annealed, preferably by a solid phase epitaxy technique, to activate the dopants and to recrystallize the amorphized region.

A disadvantage of the method described above is that it is difficult to obtain full control of the halo as to position and profile of the activated dopant. It is very important to obtain a thin (a few nm), highly activated, abrupt and well-positioned, i.e. around the extensions, halo. Since it is very difficult to fulfill these requirements when implanting and performing a standard high temperature anneal, the sharpness and abruptness of the halos should be much improved to improve the performance of the semiconductor device.

Furthermore, it is a problem that the profiles of activated dopants for the halos and the extensions more or less overlap. It is very difficult to obtain layers of activated dopants with a well defined concentration profile and a very small thickness (less than 10 nm).

SUMMARY OF CERTAIN INVENTIVE ASPECTS

Certain aspects of the present invention provide a semiconductor substrate with a layer structure of activated dopants, wherein the properties and position of at least one layer may be set with a high degree of accuracy.

The above objective is accomplished by a method and device according to the present invention.

In a first aspect of the present invention provides a method for processing a semiconductor device so as to provide a layer structure of activated dopants in a semiconductor substrate. The method comprises:
providing a semiconductor substrate having an amorphous sub-volume, for example by amorphizing a part of the substrate to so form the amorphous sub-volume,
implanting a first dopant in the amorphous sub-volume,
after implanting the first dopant, activating, by means of solid phase epitaxy regrowth, the first dopant in a first part of the amorphous sub-volume to form a boundary region which is smaller than the sub-volume, whereby a second part of the amorphous sub-volume remains amorphous,
after activating the first dopant, implanting a second dopant in the second part of the amorphous sub-volume, and
after implanting the second dopant, activating the second dopant in the second part of the amorphous sub-volume.

In certain embodiments, activating the second dopant may be performed by means of solid phase epitaxy regrowth or by laser thermal anneal.

In preferred embodiments, solid phase epitaxy regrowth may be performed at a temperature between 500° C. and 800° C. during an activation period of less than 1000 seconds. Preferably the activation period is shorter than 5 seconds.

In a method according to aspects of the present invention, implanting and activating the first dopant may be used to form a pocket in the semiconductor substrate, and implanting and activating the second dopant may be used to form a doped region, for example an extension, at least partially surrounded by the pocket.

The formed boundary region may have a thickness between 0.5 and 5 nm, preferably between 1 and 3 nm.

Implanting of the first dopant may be performed so as to provide a concentration of the first dopant having a maximum in the boundary region.

In another aspect of the invention, a semiconductor device with a layer structure of activated dopants is disclosed. For example a field effect transistor device is provided comprising a semiconductor substrate with a) a gate structure, b) a source structure with a source extension at least partially surrounded by a source pocket, and c) a drain structure with a drain extension at least partially surrounded by a drain pocket, wherein at least one of the source pocket and the drain pocket have been fabricated in accordance with a method of the present invention.

In another aspect, a semiconductor device is disclosed. The device comprises a substrate with at least one sub-volume, the sub-volume comprising a layered structure of a boundary region with a first dopant having a first doping concentration, the boundary region being smaller than the sub-volume, and a remaining part with a second dopant having a second doping concentration higher than the first doping concentration, the remaining part at least partially being surrounded by said boundary region. The boundary region has a thickness between 0.1 nm and 5 nm, preferably between 1 and 3 nm.

The boundary region may for example have the form of a pocket or halo.

The boundary region may have a concentration abruptness of better than 2 nm/decade at a boundary of said boundary with the substrate.

The semiconductor device may comprise a control electrode and a first and a second main electrode structures, at least one of the main electrode structures being made in a sub-volume of the semiconductor device as described above.

These and other characteristics, features and advantages of aspects of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1A:
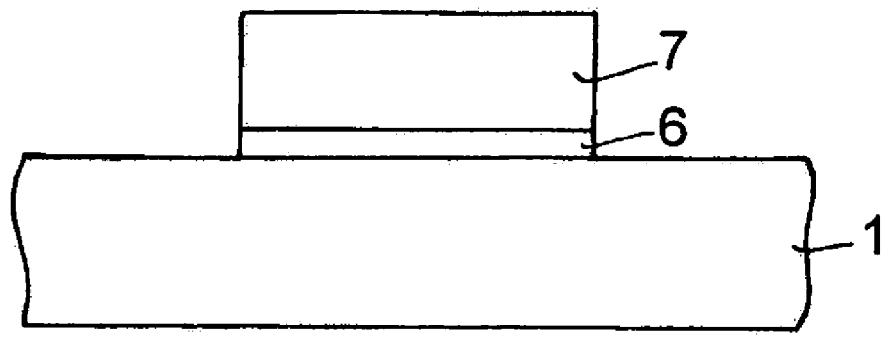
FIGS. 1a–c schematically show cross-sectional views of a part of a transistor device during three subsequent stages in an embodiment of a method according to the present invention.

In the different figures, the same reference figures refer to the same or analogous elements.

DESCRIPTION OF ILLUSTRATIVE
EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

An aspect of the present invention provides a method for forming a semiconductor device, such as for example a MOSFET, comprising a semiconductor substrate 1 with a layer structure of activated dopants. The properties and position of at least one layer may be set with a high degree of accuracy. Methods according to the invention may be used in many methods for fabricating semiconductor devices comprising insulated control electrodes, for example gates, and at least two main electrodes, for example a source and a drain electrode.

Figure 1B:
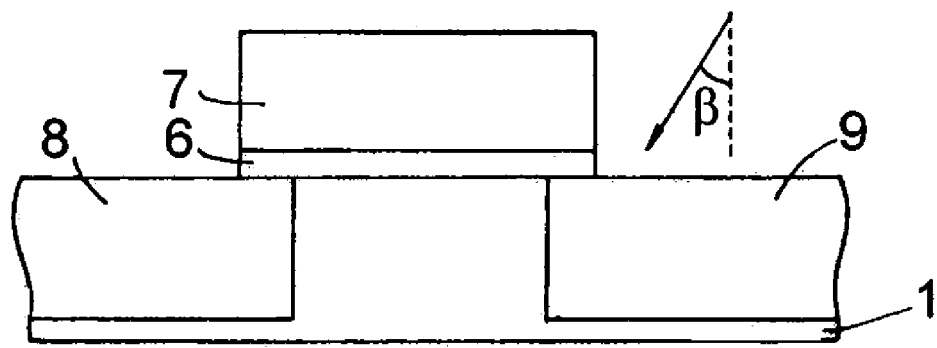
Figure 1C:
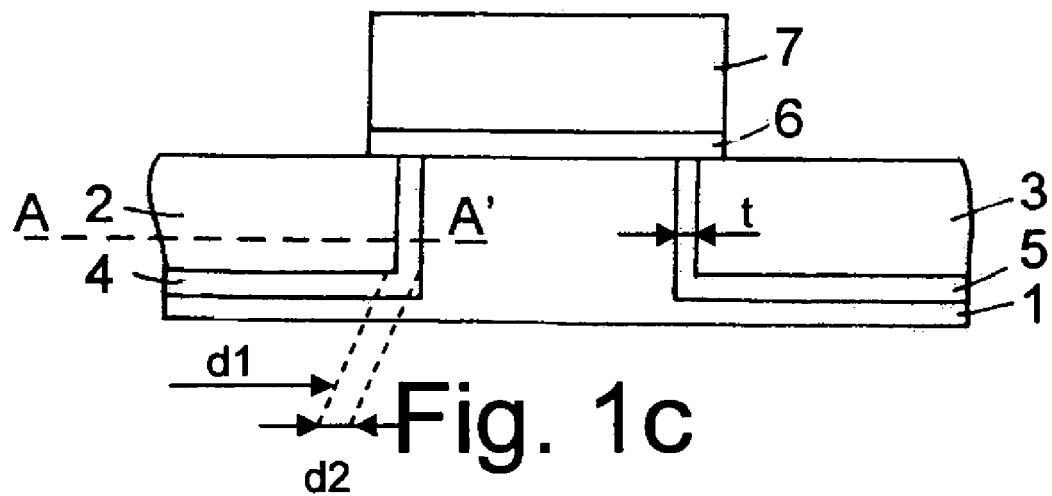

In the description hereinafter, a method is described for the manufacturing of a device having a gate as control electrode and a source and a drain as first and second main electrodes. This example is used only for the ease of explanation and is not intended to be limiting for the invention. FIG. 1a to FIG. 1c illustrate different steps in the manufacturing according to an embodiment of the present invention of a MOSFET device comprising source extension 2 and drain extension 3, and a boundary region in the form of pockets or halos 4, 5 around those source and drain extensions 2, 3. In the embodiment described, formation of pockets or halos 4, 5 is selected as an example. However, boundary regions having other structures with well localized and thin layers of activated dopants may also be formed using the method of the present invention.

In a first step, a structure as represented in FIG. 1a is formed. This structure may be formed by the following subsequent steps. On top of a semiconductor substrate 1, an insulating layer, for example a gate insulating layer 6, may be formed or deposited by any suitable method, depending on the insulating material used, such as for example thermally grown oxides, which may optionally be post treated such as for example nitrided silicon oxides. Alternatively, chemical vapor deposition techniques (CVD) may be used to form high-k dielectrics such as $HfO_2$. The substrate 1 may be any kind of semiconductor material such as for example pure silicon, germanium, gallium arsenide or others. The substrate 1 may furthermore be a doped semiconductor, such as for example n-type silicon or p-type silicon, or a combination thereof. The gate insulating layer 6 may be any suitable type of insulator material, such as for example silicon dioxide, a nitride or any other appropriate insulator.

On top of the insulating layer 6 a layer of conductive material may be deposited by means of any suitable deposition technique such as for example sputter deposition or spin coating. The conductive layer may be any suitable conductive material for this purpose, such as for example a semiconductor layer such as e.g. polysilicon which may be silicided or not, or a metal layer such as e.g. gold, aluminum or copper, or an inorganic conductive layer such as an indium tin oxide (ITO) layer. The gate electrode 7 may then be formed by means of etching back the conductive layer to the form of an electrode. Therefore a mask is applied onto that part of the conductive layer which will later form the gate electrode 7. The mask may be made of any suitable material, such as for example a polymer, which may be deposited onto the conductive layer by means of for example spin coating. The conductive layer may then be etched in order to remove that part of the conductive layer which is not covered by the mask. The same masking step may also be used to etch the part of the gate insulating layer 6 which is not under the gate electrode 7. Therefore, an etching solution, which may etch both the conductive material of the gate electrode 7 and the insulating material of the gate insulating layer 6, may be used.

The structure of FIG. 1a is then subjected to a preamorphization implant step (PAI), resulting in two amorphized regions 8 and 9, which may later form a source extension region 2 and a drain extension region 3, respectively. This step is illustrated in FIG. 1b.

PAI is a well controllable method which limits the depth to which implants can be made. Thereto, atoms, or more precisely ions, are implanted in a sufficient concentration to disrupt the originally perfect crystal lattice of the substrate 1, so that it becomes amorphous. The step of amorphizing by bombarding under a suitable angle ensures that a part of the accelerated ions used in the bombarding will pass through the part of the gate electrode 7 nearest the semiconductor substrate 1, and will hence form an amorphized region 8, 9 in the semiconductor substrate 1 showing overlap with the gate electrode 7.

The PAI may be performed with a desired dopant, dose and energy, and under a desired implant angle β, shown in the figure as the angle with respect to a direction perpendicular to the plane of the substrate 1, which is indicated by the dashed line in FIG. 1*b*. Examples of dopants which may be used for PAI are Ge, Xe, Sb and Ar. Dose, energy and angle used for the PAI may be selected according to requirements for the structure to be formed, in particular to the depth thereof. For example, in the specific case of a Ge PAI, implantation may occur at 20 keV with $5.10e14$ atoms/cm$^3$ and under an angle between 0° and 45°. Furthermore, the choice of dopants depends on the semiconductor material used for the substrate 1.

A following step in the method of the present invention is the pocket dopant implant with first dopants, i.e. dopants of a first type. The implant angle of the first dopants may substantially be the same as the angle used in the PAI step in order to make optimum use of the obtained amorphous regions 8, 9. However, in an alternative embodiment, the implant angle of the first dopants may be different from the angle used during the PAI. For the pocket 4, 5 implant, it may be possible to use any desired and appropriate implant conditions, depending on the type of dopants and semiconductor substrate 1 that are used. In the case of NMOS devices for example boron may be implanted under typical but not limiting circumstances such as for example a doping concentration of $4.10e13$ atoms/cm$^3$ at an energy of 4 keV. In case of PMOS devices for example phosphorus may be implanted with for example a doping concentration of $4.10e13$ atoms/cm$^3$ at 20 keV energy.

In a next step the implanted first dopants are then activated in exactly that part of the amorphized regions 8, 9 that may become the source and drain pockets 4, 5 (FIG. 1*c*). In a preferred embodiment, a solid phase epitaxy regrowth (SPER) step is performed to activate the dopants. In SPER, an amorphous material may be heated to such a temperature that the reordering of the constituents of the lattice may occur fast enough, but that no unwanted side effects, such as for example diffusion of the dopants, take place. Typical temperatures in SPER may be between 500 and 800° C., preferably between 550 and 650° C. The temperature may be determined by the kind of amorphized semiconductor material, the dopant dose, the desired regrowth speed and constraints such as maximum allowed temperature for the gate insulating material 6.

The time period for applying SPER may depend on the working temperature, the dopants dose and in particular on the desired thickness of the layer to be activated, i.e. in this embodiment the thickness t of the pockets 4, 5, and may for example be between 0.5 and 1000 seconds. Preferably, the activation period is shorter than for example 5 seconds. By choosing such short activation periods, disadvantageous effects on material and structures surrounding the region to be activated may be avoided to a high degree. In particular, the source pocket 4 and/or drain pocket 5 may have a thickness t between 0.5 and 5 nm, preferably between 1 and 3 μm. A pocket 4, 5 of such thickness having a well-defined activated dopant profile is very useful in for example very small MOSFET-devices. For example, sufficient regrowth and activation of a layer of 1–3 nm thickness of the dopant profile may be achieved at temperatures of 600° C. and in a time period between 1 to 5 seconds.

For the time being, the extension regions 2 and 3 in FIG. 1*c* defined as the remainder of the original region respectively 8, 9 minus the corresponding pocket region 4, 5, remain amorphous, and the pocket dopants that have been implanted in these regions will not be activated by the above described activation step—the activation step only taking place in that part of the amorphized regions 8, 9 that may become source and drain pockets 4, 5. Furthermore, the pocket dopants that have been implanted outside the amorphized regions 8, 9 will not be activated, because the still crystalline part of the semiconductor substrate 1 will not be affected or influenced by the SPER and hence, the dopants will not be built into the lattice.

With respect to FIG. 1*c*, it is to be noted that in practical cases the structures will have slightly rounded-off edges, e.g. both the pockets 4, 5 and the extensions 2, 3 will bend slightly away from the gate electrode 7, due to for example shading effects. However, this will not be detrimental to the functioning of the device.

In a next step, an implant of the extensions 2, 3 is performed with second dopants, which may again occur under substantially the same implant angle as, or a different implant angle than in the previous implant steps. Some typical values for energy and dose concerning the extension implant in case of NMOS devices are for example the implantation of arsenic at 1.5 keV and with $1.10e15$ atoms/cm$^3$. In case of PMOS devices for example boron may be implanted at 1.5 keV and with $1.10e15$ atoms/cm$^3$. Dopants, doses and energy of the extension implant may depend on the desired properties of the extensions 2, 3 and may be chosen accordingly. The extension implant is performed advantageously such that at least the complete remaining amorphous regions are filled with the second dopants. Any second dopants ending up in the pocket regions 4, 5 will not harm, because they will not be activated as the first dopants in the pocket regions 4, 5 already have been activated in a previous step.

In a next step the extension implants are activated, which may, in an advantageous embodiment of the invention, be performed by means of for example a SPER or a laser thermal anneal (LTA) step. Both annealing methods ensure that the properties of the boundary region, in this embodiment the pocket or halo 4, 5 comprising the activated first dopants, will remain substantially unchanged. Solid phase epitaxy regrowth is a low temperature recrystallization method in which the constituents of the amorphous region rearrange into a regular crystal lattice. In a laser anneal the material is melted, with high diffusion only in the amorphous layer as a result. Laser anneal is a selective process in which only amorphous material, which has a lower melting point than crystalline material, will be melted. Both methods only affect the remaining amorphous regions, wherein in laser thermal anneal the dopants are distributed evenly over the annealed sub-volume because of much higher diffusion whereas in solid phase epitaxy regrowth the dopant concentration profile is retained. By applying activation such as e.g. SPER or LTA, the remaining regions are activated and become source extension 2 and drain extension 3, respectively. A preferred temperature range for the extension activation step, for example for SPER, may be between 550 and 650° C. At these temperatures SPER will take a time of a few dozens of seconds, for example 40 seconds, to anneal and activate the remaining amorphous regions into extensions 2 and 3. Applying a higher temperature may result in a shorter time period for the SPER step. The first dopants which have been implanted in the remaining regions 2 and 3 may also be activated during the same step. However, since in most cases their concentration may be much less, mostly at least around two orders of magnitude, their activation may have no measurable effect on the extensions 2, 3. It is not necessary to use SPER or LTA for annealing the remaining amorphous regions with the second dopant. It is also possible to use other annealing methods, such as for example rapid thermal anneal (RTA). However, the latter method may influence the source and drain pockets 4, 5 around the extensions 2, 3 at least partially, and will hence have influence on the properties of the pockets 4,5.

After the above steps, other steps, such as deep implants for the source and drain, may be performed according to any desired method, such as for example a CMOS process flow, as known by persons skilled in the art.

Figure 2:
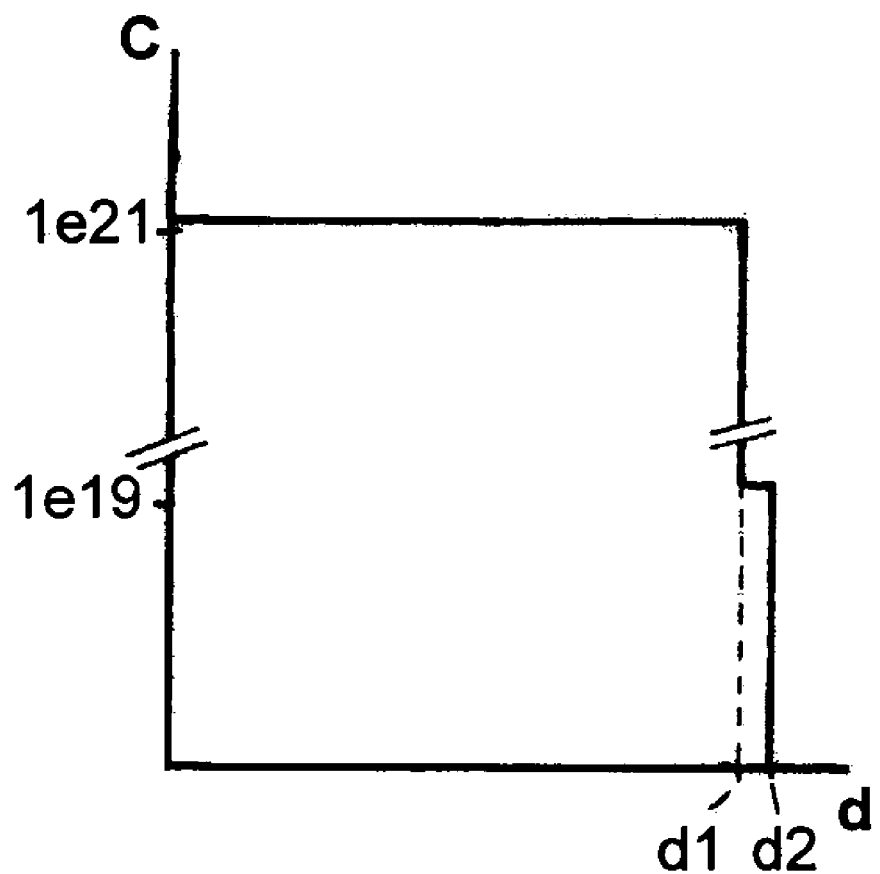
FIG. 2 shows an exemplary dopant concentration profile of an electrode extension and pocket fabricated in accordance with an embodiment of a method according to the present invention.

In FIG. 2 a concentration profile of activated dopants for extension region 2, along the line A–A' in FIG. 1c is shown. The x-axis denotes the distance d from left to right, and the y-axis denotes the dopant concentration c. The different scales for the different regions are to be noted, each region having in fact a different type of dopant.

In the diagram, the part of the diagram between d=0 and d=d1 corresponds to the extension region 2 and the part between d=d1 and d=d2 corresponds to the pocket region 4. It can be seen that the concentration/activation is very high in the extension region 2. It is also more or less constant, due to the selected annealing method such as e.g. LTA or SPER. It is also to be noted that the transition between the high concentration of second dopant in the extension region 2 very abruptly changes to the much lower concentration of the first dopant in the pocket region 4. In fact, the concentration of activated second dopant in the pocket region 4 is substantially negligible.

In principle the first dopant may have any desired concentration profile. In general, it is relatively easy to limit the implant to the amorphous regions 8, 9. Preferably, when implanting a first dopant in at least a sub-volume of the semiconductor substrate 1, the implanting is performed to provide a concentration of the first dopant having a maximum in the boundary region or pocket 4, 5. This offers the advantage of the highest concentration of activated first dopant in the pocket region 4, 5, where it is most effective. This limits the time, energy and amount of material to be used in the implanting step of the first dopant. It is, however, possible to implant the first dopant with a different profile, for example the part of the amorphous regions 8, 9 which will later form the pockets 4, 5 may be implanted with the "tail" of a concentration profile, wherein the maximum lies outside the pockets 4, 5. In most cases, the remaining part of the remaining amorphous region may be implanted with a second dopant in a higher concentration than that of the first dopant, which ensures that the presence of the first dopant in said remaining amorphous regions will have no negative influence on the properties of the remaining regions.

In practice some smoothening of the concentration profile may occur. However, with a preferred method, it is possible to obtain exceptionally abrupt pockets 4, 5 with concentration abruptness within 1 nm/decade, and also at exactly the desired spot, i.e. directly neighboring the extensions 2, 3. This location may be determined to within 1 nm. Due to these properties it is possible to fulfill requirements of the International Technology Roadmap for Semiconductors (ITRS) as to ultra shallow junctions at small dimensions. The devices obtained by the method of the present invention are the first to fulfill these requirements.

Another advantage of certain embodiments of the present invention is that by separating the implanting step of the boundary region with the first dopant, i.e. the pockets 4, 5 and the implanting step of the region with the second dopant, i.e. the extensions 2, 3 and by applying an activation step of solid phase epitaxy regrowth after the implantation step of the first dopant, a controllable and, if desired, very thin layer of a dopant may be activated in the region with the first dopant, forming the pockets 4, 5. Implanting the second dopant with a profile that overlaps said thin layer, after activation of this thin layer, will have no effect within the thin layer, because said second dopant cannot be activated in the layer for the thin layer when the first dopant has already been recrystallized and the first dopant has been built into the crystal lattice. Only in the remaining, still amorphous sub-volume it is possible to activate the implanted separate second dopant, e.g. with a SPE or a laser anneal step. In this way it is possible to obtain a well controlled thin layer of an activated dopant that borders a region that may have totally different dopant properties. The abruptness of the border between the thin layer or pocket 4, 5 and the extensions 2, 3 may be very high as to the concentration profile of activated dopants. Furthermore, it is advantageous that the pockets 4, 5 exactly border the extensions 2, 3 with the separate dopant.

Methods of the present invention may further be applied for the manufacture of semiconductor devices comprising boundary regions with structures other than pockets.

It is to be understood that although preferred embodiments, specific constructions and configurations, as well as materials, have been discussed herein for devices according to the present invention, various changes or modifications in form and detail may be made without departing from the scope and spirit of this invention.

What is claimed is:

1. A method of providing a layer structure of activated dopants in a semiconductor substrate, the method comprising:
    forming at least one amorphous sub-volume in a semiconductor substrate;
    implanting a first dopant in the amorphous sub-volume;
    activating the first dopant only in a first region of the amorphous sub-volume to form a boundary region within the sub-volume, wherein activating comprises recrystallizing the first region;
    implanting a second dopant in a second region of the amorphous sub-volume after activating the first dopant, and
    activating the second dopant in the second region of the amorphous sub-volume.

2. The method of claim 1, wherein forming the amorphous sub-volume comprises performing a pre-amorphization implant step.

3. The method of claim 1, wherein activating the first dopant comprises performing a first SPER step.

4. The method of claim 3, wherein activating the second dopant comprises performing a second SPER step.

5. The method of claim 1, wherein activating the second dopant comprises performing a laser thermal anneal step.

6. The method of claim 4, wherein performing the first SPER step and the second SPER step comprises applying a temperature of between about 500° C. and 800° C.

7. The method of claim 6, wherein performing the first SPER step and the second SPER step comprises applying a temperature of between about 550° C. and 650° C.

8. The method of claim 4, wherein performing the first SPER step and the second SPER step comprise using an activation period of less than about 1000 seconds.

9. The method of claim 8, wherein the activation period is shorter than about 5 seconds.

10. The method of claim 1, wherein implanting and activating the first dopant is used to form a pocket in the semiconductor substrate.

11. The method of claim 10, wherein implanting and activating the second dopant is used to form an extension at least partially surrounded by the pocket.

12. The method of claim 1, wherein forming the boundary region comprises forming a layer with a thickness of between about 0.5 and 5 nm.

13. The method of claim 12, wherein the thickness of the boundary region is between about 1 and 3 nm.

14. The method of claim 1, wherein implanting the first dopant comprises implanting the first dopant with a maximum concentration in the boundary region.

15. A method of forming a transistor comprising:
    forming a first amorphous region and a second amorphous region in a semiconductor substrate;
    implanting a first dopant in the amorphous regions;
    activating the first dopant in portions of the amorphous regions to form a first boundary region lining the first amorphous region and a second boundary region lining the second amorphous region;
    implanting a second dopant in the amorphous regions; and
    activating the second dopant in each amorphous region to form a source extension at least partially surrounded by the first boundary region and a drain extension at least partially surrounded by the second boundary region.

* * * * *

UNITED STATES PATENT AND TRADEMARK OFFICE
CERTIFICATE OF CORRECTION

PATENT NO. : 7,214,592 B2 Page 1 of 1
APPLICATION NO. : 10/966145
DATED : May 8, 2007
INVENTOR(S) : Surdeanu It is certified that error appears in the above-identified patent and that said Letters Patent is hereby corrected as shown below:

Column 1, Line 20 (Approx.), Delete "modem" and insert -- modern --.

Signed and Sealed this

Twentieth Day of May, 2008

JON W. DUDAS
*Director of the United States Patent and Trademark Office*